United States Patent
Seshadri et al.

(10) Patent No.: US 6,584,593 B1
(45) Date of Patent: Jun. 24, 2003

(54) CONCATENATION OF TURBO-TCM WITH SPACE-BLOCK CODING

(75) Inventors: Nambirajan Seshadri, Chatham, NJ (US); Vahid Tarokh, Madison, NJ (US); Gerhard Bauch, Starnberg (DE)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/409,534

(22) Filed: Sep. 30, 1999

Related U.S. Application Data

(60) Provisional application No. 60/102,771, filed on Oct. 2, 1998.

(51) Int. Cl.[7] .......................... A03M 13/00; H04K 1/10; H04B 7/02
(52) U.S. Cl. ....................... 714/752; 714/792; 375/260; 375/265; 375/267; 375/347; 375/349
(58) Field of Search .................................. 714/752, 792, 714/793, 794, 795, 796; 375/341, 267, 240, 265, 296, 254, 285, 349; 342/368

(56) References Cited

U.S. PATENT DOCUMENTS

| | | | | |
|---|---|---|---|---|
| 5,479,448 A | * | 12/1995 | Seshadri | 375/267 |
| 6,115,427 A | * | 9/2000 | Calderbank et al. | 375/267 |
| 6,127,971 A | * | 10/2000 | Calderbank et al. | 342/368 |
| 6,185,258 B1 | * | 2/2001 | Alamouti et al. | 375/260 |
| 6,430,231 B1 | * | 8/2002 | Calderbank et al. | 375/295 |

OTHER PUBLICATIONS

Hagenhouer et al, Iterative Decoding of Binary Block and Convolutional Codes, IEEE Trans. On Information Theory, vol. 42, No. 2, Mar. 1996.

* cited by examiner

Primary Examiner—Emmanuel L. Moise

(57) ABSTRACT

Improved communication arrangement is realized with an arrangement where a turbo TCM code is concatenated with a space-time code as an outer code. The signal is decoded by employing a MAP decoder followed by a turbo decoder.

6 Claims, 2 Drawing Sheets

US 6,584,593 B1

CONCATENATION OF TURBO-TCM WITH SPACE-BLOCK CODING

REFERENCE TO RELATED APPLICATIONS

This application is related to:

U.S. application Ser. No. 09/186,908, filed Nov. 6, 1998, titled "Generalized Orthogonal Designs for Space-Time Codes for Wireless Communication," now U.S. Pat. No. 6,430,231, which is based U.S. Provisional Application filed Nov. 11, 1997;

U.S. application Ser. No. 09/114,838 filed Jul. 14, 1998, titled "Combined Array Processing and Space-Time Coding," now U.S. Pat. No. 6,127,971 which is based on U.S. Provisional Application No. 60/052,689, filed Jul. 17, 1997; and U.S. application Ser. No. 09/300,494, filed Apr. 28, 1999, titled "Combined Channel Coding and Space-Block Coding In a Multi-Antenna Arrangement," which is based on U.S. Provisional Application No. 60/099,212 filed Sep. 4, 1998.

CLAIM OF PRIORITY

This application claims the benefit of U.S. Provisional Application No. 60/102,771, filed Oct. 2, 1998 expired, which is hereby incorporated by reference.

BACKGROUND OF THE INVENTION

This invention relates to wireless communication and, more particularly, to techniques for effective wireless communication in the presence of fading, co-channel interference, and other degradations.

A significant body of information relating to this disclosure can be found in the aforementioned U.S. Patent '908, '838, and '494 applications. These applications are, therefore, hereby incorporated by reference in order to shorten the exposition of this invention. Some of this information, however, is summarized below.

In U.S. application Ser. No. 09/074,224 titled "Transmitter Diversity Technique for Wireless Communication," now U.S. Pat. No. 6,185,258, Alamouti introduces a transmit diversity scheme for two transmit antennas with a corresponding decoding algorithm that is very simple. The notions introduced by Alamouti were extended and generalized by Calderbank et al in the aforementioned '908 application. In that disclosure, data is encoded using space-time block codes with orthogonal structures. The encoded data is split into $n_T$ streams and $n_T$ symbols are transmitted simultaneously using $n_T$ antennas. The received signal is the superposition of the $n_T$ transmitted signals, perturbed by noise. The orthogonal structure of the space-time block code allows the use of a simple decoding algorithm by decoupling of the signals transmitted from the different antennas. Space-time block codes are designed to achieve maximum possible diversity of order $n_T n_R$ for $n_T$ transmit antennas and $n_R$ receive antennas, under the constraint of having a simple decoding algorithm. However, space-time block codes are not designed to, and do not achieve coding gain.

It was realized later that such gain may be realized by concatenating an outer code to the space-time coding. Indeed, in the aforementioned '838 application, a system is disclosed with increased system capacity and improved performance that are attained by using a concatenated coding scheme where the inner code is a space-time block code and the outer code is a conventional channel error correcting code. As disclosed in that application, information symbols are first encoded using a conventional channel code and the channel encoded signal is then encoded using a space-time block code. The result is transmitted over the $n_T$ antennas. At the receiver, the inner space-time block code is used to suppress interference from the other co-channel terminals and soft decisions are made about the transmitted symbols. The channel decoding that follows makes the hard decisions about the transmitted symbols.

SUMMARY

Disclosed is an arrangement where a turbo TCM code is concatenated with a space-time code, forming an outer code. The signal is decoded by employing a MAP decoder followed by a turbo decoder.

DETAILED DESCRIPTION

Figure 1:
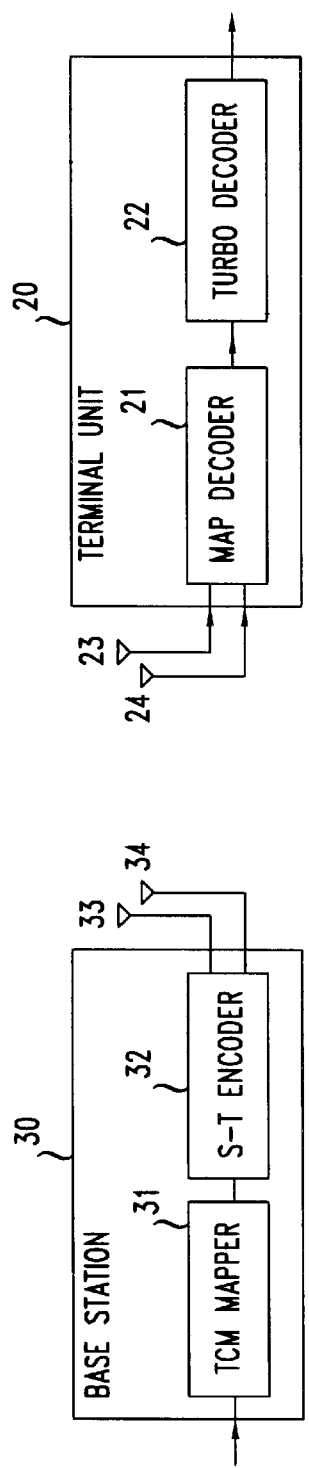
FIG. 1 depicts an arrangement that, illustratively, includes a base station 30 with a TCM encoder forming an outer coder, followed by a space-time encoder that feeds two antennas, and a terminal unit 20 with two antennas, a a posteriori probability (MAP) space-time decoder followed by a turbo decoder.

FIG. 1 depicts an arrangement that, illustratively, includes a base station 30 with two antennas, and a terminal unit 20 with two antennas. The arrangement can be generalized to $n_T$ transmitting antennas and $n_R$ receiving antennas, and the following mathematical treatment, by and large, considers the general case. Base station 30 is shown with a turbo-trellis coded modulation (turbo-TCM) encoder 31 that is responsive to an input signal, and a space-time encoder 32 that is responsive to encoder 31 and which provides symbols to antennas 33–34. Terminal unit 20 includes a MAP space-time decoder unit 21, followed by turbo decoder unit 22. At each time instant t=1, 2, . . . , p, the transmitter sends out a set of constellation symbols $g_{ti}$, and the transmitted symbols of each antenna are orthogonal to the others.

Figure 2:
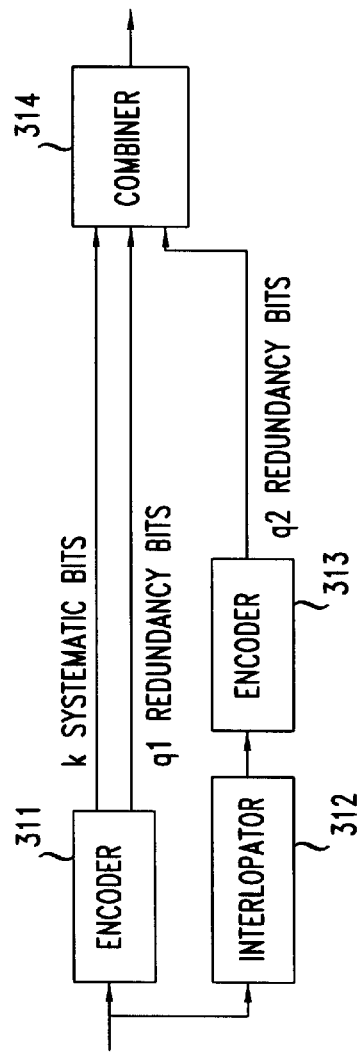
FIG. 2 illustrates one block diagram of a TCM encoder adapted for the FIG. 1 arrangement.

FIG. 2 presents a block diagram of an illustrative encoder 31. Persons skilled in the art would appreciate that there are many designs for TCM codes. In FIG. 2, a string of k input bits is applied to encoder 311, which develops an output string of k systematic bits and n1 redundancy bits. The same input string of k bits is also applied to interleaver 312 that supplies encoder 313. Encoder 313 develops q2 redundancy bits but, of course, q2 could be equal to q1. The k systematic bits from encoder 311, the q1 redundancy bits from encoder 311, and the q2 redundancy bits from encoder are gathered in combiner 314 and applied to the output port of turbo-TCM encoder 31. The redundancy bits of encoders 311 and 313 may, be punctured to achieve a desired number of information bits per transmitted symbol, making sure that an equal number of redundancy bits from encoder 311 and 313 are transmitted. As an aside, a block of bits that is interleaved to form a coded output of block 31 is typically much larger than a frame of bits that is employed in forming the space-time coding of block 32. With a two-antenna arrangement, for example, the space-time coding frame is two bits long.

The string of bits thus applied to space-time encoder 32 is encoded in accordance with prior art techniques and applied to the transmitting antenna of unit 30.

At the receiver, block 21 is a MAP space-time decoder. It computes probability values, which form the channel information, and applies those to decoder 22.

Before proceeding with the mathematical treatment of the computations at receiver 20, it may be noted that, in the following treatment, the bits from the binary representation of the signal of source X form word $d_k$, which are encoded to form real valued symbols, $c_k$ taken from a set of M symbols. Those symbols are mapped onto complex constellation symbols $g_{ti}$ and sent by base station 30 at time t. At each such time instant and at each receive antenna $m=1, 2, \ldots, n_R$, the received signal at antenna m, $r_m(t)$ is the superposition of signals transmitted from the $n_T$ antennas, perturbed by additive white Gaussian noise (AWGN).

The aposteriori probability of the transmitted sequence $c=(c_1, \ldots, c_k)$, given a received sequence $r_1(t), \ldots, r_p(t)$, can be expressed—using Baye's rule—by $$p(c_1, \ldots, c_k | r_1, \ldots, r_1, \ldots, r_p) = A \cdot p(r_1, \ldots, r_p | c_1, \ldots, c_k) \cdot p(c_1, \ldots, c_k) \quad (1)$$

where A is a constant. The first probability term on the right hand side of equation (1) can be expressed by $$p(r_1, \ldots, r_p | c_1, \ldots, c_k) = \frac{1}{2\pi\sigma^2} e^{\frac{-1}{2\sigma^2} \sum_{m=1}^{n_R} \sum_{t=1}^{p} |r_m(t) - \sum_{n=1}^{n_T} g_{tn}\alpha_{nm}|^2}, \quad (2)$$

where $r_m(t)$, is the signal received at receiving antenna m at time t, and the $g_{tn}$ terms are terms in the space-time transmission encoding matrix $\mathcal{G}$, as disclosed in the aforementioned '908 patent application. The second probability term on the right hand side of equation (1), $p(c_1, \ldots, c_k)$, is the apriori probability information, which can be obtained from knowledge of the source statistics or from the aposteriori information of another decoder. Since the $c_i$ symbols are statistically independent, the apriori term can be factorized:

$$p(c_1, \ldots, c_k) = \prod_{i=1}^{k} p(c_i). \quad (3)$$

Revisiting equation (1)

$$p(c_1, \ldots, c_k | r_1, \ldots, r_p) = \quad (4)$$

$$\frac{A}{2\pi\sigma^2} e^{\frac{-1}{2\sigma^2} \sum_{m=1}^{n_R} \sum_{t=1}^{p} |r_m(t) - \sum_{n=1}^{n_T} g_{tn}\alpha_{nm}|^2} \cdot \prod_{i=1}^{k} p(c_i),$$

and $$\ln p(r_1, \ldots, r_p | c_1, \ldots, c_k) = \quad (5)$$

$$const - \frac{1}{2\sigma^2} \sum_{m=1}^{n_R} \left\{ \sum_{t=1}^{p} \left[ -r_m(t) \sum_{n=1}^{n_T} g_{tn}^* \alpha_{nm}^* - r_m(t)^* \sum_{n=1}^{n_T} g_{tn}\alpha_{nm} \right] + \sum_{t=1}^{p} \sum_{n=1}^{n_T} (|g_{tn}|^2 |\alpha_{nm}|^2) \right\}$$

where k is the number of symbols in a block of transmitted symbols. Since all constellation symbols that are transmitted from the same antenna are multiplied by the same fading factor $\alpha_{nm}$, and since the columns of the $\mathcal{G}$ matrix are orthogonal to each other, we can decouple the aposteriori probabilities for symbols ci to obtain the simple expressions for the aposteriori probabilities:

$$\log p(c_i | r_1, \ldots, r_p) = const + \log p(r_1, \ldots, r_p |_i) + \log p(c_i) \quad (6)$$

Thus, when, for example, there are two transmitting antennas and two receiving antennas ($n_T=2$, $n_R=2$), when a block of transmitted symbols consists of 2 symbols (k=2), and two time slots are used to transmit the block of symbols (p=2), equation (5) results in $$\ln p(c_1 | r_1, r_2) = const - \frac{-1}{2\sigma^2} \left( \left| \left[ \sum_{m=1}^{2} (r_m(1)\alpha_{1m}^* + r_m^*(2)\alpha_{2m}) \right] - x_1 \right|^2 + \left( -1 + \sum_{m=1}^{2} \sum_{n=1}^{2} |\alpha_{nm}|^2 \right) |g_1|^2 \right) + \ln p(c_1) \quad (7)$$

and $$\ln p(c_2 | r_1, r_2) = const - \frac{-1}{2\sigma^2} \left( \left| \left[ \sum_{m=1}^{2} (r_m(1)\alpha_{2m}^* + r_m^*(2)\alpha_{1m}) \right] - x_2 \right|^2 + \left( -1 + \sum_{m=1}^{2} \sum_{n=1}^{2} |\alpha_{nm}|^2 \right) |g_2|^2 \right) + \ln p(c_2) \quad (8)$$

In the general case, where a time-space code comprises a block of N symbols generated from the k systematic bits and the q1 and q2 redundancy bits, where the symbols are from a constellation of M points, there are NM values that are computed. These are the values (channel information) that block 21 generates and applies to block 22, whose block diagram is depicted in FIG. 3.

Figure 3:
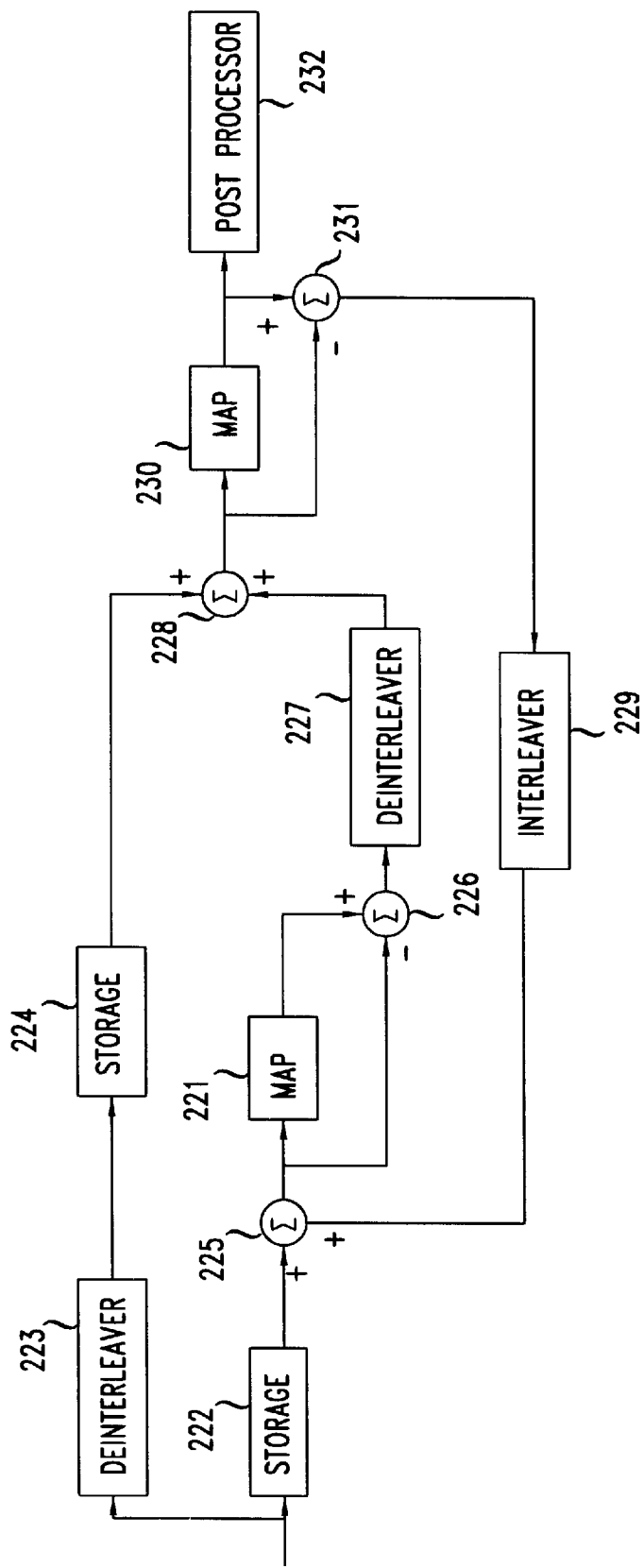
FIG. 3 presents one block diagram of a turbo decoder that is adapted for the FIG. 1 arrangement.

In FIG. 3, the channel information is stored in storage element 222, is simultaneously applied to deinterleaver 223, and the output of deinterleaver 223 is applied to storage element 224. Storage elements 222 and 224 accummulate the N signals developed by element 21 in accordance with equation (6), and only when the set of signals is accumulated, the processing of FIG. 3 proceeds. The signals of storage element 222 are applied to MAP processor 221 through adder 225, and the signals of stage element 224 are applied to MAP processor 230 through adder 228. In the first processing interval, the other input of adders 225 is zero. The output signals developed by MAP processor 221 are applied to subtractor 226, where the input signals of MAP processor 221 are subtracted from the output signals developed by MAP processor 221. The difference signals are applied to deinterleaver 227, and the output of deinterleaver 227 is applied to adder 228. The output signals developed by MAP processor 230 are applied to subtractor 231, where the input signals of MAP processor 230 are subtracted from the output signals developed by MAP processor 230. The difference signals of subtractor 231 are applied to interleaver 229, and the output of interleaver 229 is applied to adder 225.

In operation, during a first processing interval after storage element 222 has been populated, MAP processor 221 develops a set of output signals. Those signals are applied to deinterleaver 227 and thence to MAP processor 230, together with the channel information from storage element 224. The resulting signals developed by MAP processor 230 are applied to interleaver 229, ending the first processing interval. During the second processing interval, both interleaver 229 and storage element 222 supply information to MAP processor 221, and the output signals of MAP processor 221 are applied, as described above, to MAP processor 230. Following a preselected number of iterations (i.e., processing intervals), the output of either MAP processor 221 or MAP processor 230 may be used to generate the ultimate decoded output. In FIG. 3, the output is developed from the output of MAP processor 230, through post processor 232. Processor 232 determines the most likely symbol $d_k$ that was transmitted. Illustratively, this is accomplished by evaluating the equation.

$$\sum_{d_k} p(s', s'', r)$$

and selecting the symbol $d_k$ that provides the greatest value.

It has been shown in the literature that the computation necessary to be performed in the MAP processors basically follows equation (9):

$$p(s', s'', r) = const. \sum_{s'} \sum_{s''} \alpha_{k-1}(s') \gamma_k(s', s'') \beta_k(s'') \qquad (9)$$

where s' is a state of the convolutional code employed in the encoder, and s" is the immediately succeeding station of the convolutional encoder. The $\alpha_k(s')$ term is derived by the recursive formula $$\alpha_k(s') = \sum_{s=all\ predecessors\ of\ s'} \alpha_{k-1}(s) \gamma_k(s, s') \qquad (10)$$

where $\alpha_1(j=1)=1$, and $\alpha_1(j\neq 1)=0$. The $\beta_k(s'')$ term is derived by the recursive formula $$\beta_k(s'') = \sum_{s'=all\ successors\ of\ s''} \beta_{k+1}(s') \gamma_k(s', s'') \qquad (11)$$

starting with the end state of the convolutional encoder, where $\beta_N(j=1)=1$, and $\beta_N(j\neq 1)=0$. The term $\gamma_k(s',s'')$ is derived from the equation $$\ln \gamma_k(s',s'') = \ln p(r_1, \ldots, r_p | c_k) + \ln p(s'', s') + \ln p(c_k | s', s'') \qquad (12)$$

and $$\ln p(r_1, \ldots, r_p | c_k) = \ln p(c_k | r_1, \ldots, r_p) + \ln p(c_k). \qquad (13)$$

This first term in equation (13) corresponds, of course, to the channel information that is supplied by storage elements 222 and 224. The second term in equation 13 can be computed from the source X output apriori probabilities. If these are not available, we simply drop the term.

The second term in equation (12) corresponds to the probability of symbol $d_k$ having been transmitted which, at the first processing interval, is equal to 0. In all subsequent iterations, this information corresponds to the extrinsic information that is developed in subtractor 226 and deinterleaver 227 and applied to adder 228, and in the extrinsic information that is developed in subtractor 231 and applied to adder 225.

The third term in equation (12) depends on the structure of the particular code that encoder 31 employs. For example, $p(c_k|s',s'')$ is equal to 1 if the transition (s',s'') in the trellis of encoder 31 is labeled with code symbol $c_k$. Otherwise, it is 0.

We claim:

1. An arrangement comprising:
   a plurality of receiving antennas;
   a MAP space-time decoder coupled to said plurality of antennas; and
   a turbo decoder responsive to signals developed by said MAP space-time decoder.

2. The arrangement of claim 1 further comprising a plurality of at least two antennas responsive to output signals of said space-time encoder.

3. The arrangement of claim 1 where said turbo encoder is a turbo trellis coded modulation encoder.

4. An arrangement comprising:
   a plurality of receiving antennas;
   a MAP space-time decoder coupled to said plurality of antennas; and
   a turbo decoder responsive to signals developed by said MAP space-time decoder.

5. The arrangement of claim 4 where said MAP space-time decoder evaluates probability measures.

6. The arrangement of claim 4 where said turbo decoder operates in accordance with a recursive method with two MAP processors providing information to each other.

* * * * *